United States Patent [19]
Beaufort et al.

[11] Patent Number: 5,070,529
[45] Date of Patent: Dec. 3, 1991

[54] APPARATUS FOR SEQUENTIAL INTERCONNECTION OF ELECTRICAL CIRCUIT BOARDS

[75] Inventors: Richard Beaufort; James Sangroniz; Darrell Cox, all of Boise, Id.

[73] Assignee: Hewlett-Packard Company, Palo Alto, Calif.

[21] Appl. No.: 339,435

[22] Filed: Apr. 17, 1989

[51] Int. Cl.[5] .................................... H05K 7/14

[52] U.S. Cl. .................................... 361/415; 361/413; 211/41; 439/74

[58] Field of Search .................... 361/413, 415, 395; 211/41; 439/74, 62, 65

[56] References Cited

U.S. PATENT DOCUMENTS

| | | | |
|---|---|---|---|
| 4,313,150 | 1/1982 | Chu | 361/415 X |
| 4,755,906 | 7/1988 | Belanger, Jr. | 361/413 |
| 4,840,570 | 6/1989 | Mann, Jr. et al. | 361/413 X |

OTHER PUBLICATIONS

Kubota, "Stack Assembly of Printed Circuit Cards," *IBM Technical Disclosure Bulletin*, vol. 23, No. 12, May, 1981.

*Primary Examiner*—Harold Broome
*Assistant Examiner*—Paramita Ghosh

[57] ABSTRACT

An electrical circuit board interconnection system having motherboard 13 and a plurality of option board assemblies 10. Each option board assembly 10 has circuit board 15 to which is attached male pin connector assembly 12 on one surface and a mating female connector assembly 11 on the other surface. Both connector assemblies are oriented with pins 17 and female receptacles 18 parallel to the surface of the boards 15. Ejector levers 14 attached to female connector 11 to bear against male pin housing 36 to assist in disconnection option boards 10 from each other and motherboard 13. Power transfer bus 42 and signal transfer bus 43 interconnect the male and female pin connection 12 and 11 of each circuit board 15 to facilitate the sequential interconnection of a plurality of option board assemblies 10 to motherboard 13.

8 Claims, 7 Drawing Sheets

APPARATUS FOR SEQUENTIAL INTERCONNECTION OF ELECTRICAL CIRCUIT BOARDS

DESCRIPTION

BACKGROUND OF THE INVENTION

1. Technical Field

This invention generally relates to a system for sequentially interconnecting a plurality of electrical circuit boards together. More particularly, it utilizes a male parallel pin receptacle attached to one side of each of a plurality of circuit boards and a female parallel pin receptacle attached to the opposite side of the same circuit boards for electrical interconnection of the electrical circuit boards one to the other.

2. Background Art

The typical design of a modern computer or microprocessor driven device features a main printed circuit board to which one or more accessories or option boards can be interconnected. For example, a general purpose personal computer will have within its case assembly a master printed circuit board, hereinafter the motherboard, to which is attached additional printed circuit boards for features such as input/output ports, expanded memory capability, data facsimile transmissions, voice synthesizer capabilities, graphic display capabilities and so forth. These additional printed circuit boards, expansion, accessory or option cards as they are called, can be installed at the time that the computer is initially assembled or at a later date by an infield retrofit which is accomplished at the owner's location by a traveling service technician. The typical design features the motherboard in a horizontal orientation at the bottom of a computer case with the option or accessory cards held in vertical slots in the case, perpendicular to the motherboard, and interconnected to it by means of a mating pair of male and female parallel edge connectors, one of which is attached to the surface of the motherboard and the other to the edge of the option or accessory card. If the original design envisions the use of a maximum of six accessory cards, then the motherboard must be fabricated with six parallel female receptacles attached to it at the correct locations for the particular case design. The accessory cards themselves must be designed for interconnection with a particular motherboard, and must be of uniform size and shape for insertion into the main case between opposing parallel slots designed and designated for that particular accessory card.

With personal computers, the motherboard is normally, because of its size, horizontally oriented. This enables the designer to produce a case of relatively low profile which is suitable for storage on a shelf or desk top and for supporting a CRT assembly. In the case of microprocessor controlled devices such as office copy machines, computer printers and the like, it may not always be possible, or even desirable to horizontally orient the motherboard in that such orientation would make it unduly difficult to gain access to it in the event of the need for service, repair or replacement.

COPPELMAN, Patent No. 4,480,885, teaches a method of interconnecting two printed circuit boards by use of male and female cooperating parallel pin receptacles together with a spacer member which provides ejector arms to facilitate disconnecting the two parallel pin receptacles. However, Coppelman in both its conception and design fails to solve a number of problems. First, the orientation of the receptacles is perpendicular to that of the printed circuit boards, and as a result, requires at least two degrees of freedom of access to the printed circuit boards in order to facilitate their insertion or removal. This is difficult to accomplish without major disassembly of the device since the printed circuit boards are usually held in position by insertion of at least one edge of the board into a frame or case slot. With its edge held in place, perpendicular movement of a Coppelman circuit board relative to the orientation of the motherboard is impossible.

Secondly, Coppelman teaches ejector arms which brace directly against the printed circuit board and are free to vibrate against said circuit board if, for example, it is installed upon an onboard computer of a vehicle or aircraft.

Finally, no provision is made, nor does it appear to be contemplated in Coppelman, for the interconnection of a series of printed circuit boards, interconnected sequentially one to the other.

Accordingly, it is a primary object of the present invention to provide an interconnection system for printed circuit boards in which the system facilitates serial mechanical interconnection of circuit boards one to the other. Additionally, it is an object of the invention to provide a interconnection system in which the pins and mating holes of the parallel pin receptacles are themselves oriented parallel to the surface of the circuit board such that interconnection is accomplished, one circuit board to the other, by movement of one board parallel to the orientation of the other, thus allowing for interconnection of circuit boards with only one degree freedom of access as opposed to two or more required for other interconnection systems.

A final object of the invention is the development of an interconnection system which is not limited to any particular number of expansion boards and further which eliminates the need for expansion boards of uniform size and shape.

DISCLOSURE OF INVENTION

These objects are accomplished by use of a circuit board interconnection system that utilizes mating parallel pin connectors that are oriented parallel to the surfaces of the circuit boards, thus facilitating interconnection of two or more boards by parallel movement of the circuit boards relative to each other. A male parallel pin connector is attached to one surface of the circuit board and a mating female parallel pin receptacle is attached to the other, both for interconnection with mating receptacles attached to circuit boards of similar construction.

A case is provided having a plurality of parallel circuit board retaining slots. In this manner, a plurality of circuit boards can be held parallel and interconnected one to the other in sequence.

Two electrical circuit buses are incorporated into the circuit board design, the first is an electrical power transfer bus, and the second is an electrical signal transfer bus. Power is supplied to the first circuit board in the sequence in a conventional manner. It is transferred out through a the male pin connector of the first board to the mating female pin receptacle of the second board, from where power is then transferred through the power transfer bus to the next circuit board in the sequence.

Likewise, electrical signals, are transferred back and forth through the sequence of circuit boards by the electrical signal transfer buses incorporated into the design of each circuit board. In this manner, the design of circuit boards can be modified to incorporate any number of option or accessary circuit boards for a particular application such as a personal computer or microprocessor driven device.

To eliminate the need for more than one degree of freedom of access to the circuit board case, the pins and receptacles of the mating connectors are attached to the circuit boards in an orientation parallel to the surfaces of the circuit boards and the circuit board retaining slots for the case. The male pin connectors and the female pin receptacles are positioned or located on the circuit boards in a manner so as to provide that each of the circuit boards in the parallel array or sequence of circuit boards have one common edge of each board aligned one to the other.

Stop tabs are provided on each circuit board extending out from the aligned edges to engage an edge of at least one edge of a surface of the case. By proper positioning of the pin connectors relative to the stop tabs, shear forces imparted to the pin connectors during the insertion process can be limited by the stop tabs engaging the edge of the case at the precise point when the pin connectors are fully interconnected. Also, if the male and female pin connectors extend out unequal perpendicular distances from each board, then the stop tabs will prevent overinsertion of the circuit board into the case in the event a circuit board is inserted upside down and the connectors pass each other male to male or female to female.

The male pin connector has a generally rectangular male pin housing with elongated sides and opposing ends enclosing the perimeter of the array of parallel pins. It further provides a bearing surface atop the ends of the housing for engagement with opposing ejector levers. The female pin receptacle, attached to the opposite side of each circuit board has a generally rectangular female receptacle housing with slightly shorter elongated sides and opposing ends with extension tabs for creating a space between the female receptacle ends and the ends of the male pin housing into which ejector levers can be rotated when used to disconnect mated pin connectors.

A pair of ejector levers are attached to the ends of the female receptacle housing by means of cantilevered bridge assemblies formed on each side of the female housing from upper and intermediate support plates which extend out from the ends of the female housing and an end plate interconnecting the two. A lower support plate also extends out from each end of the female housing to complete the ejector lever support assemblies.

A pair of reverse mirror image ejector levers, each having coaxially aligned pivot pins, are snap interfitted into notches cut into the side edges of the intermediate and lower support plates adjacent the open receptacle end of the female pin receptacle.

Each of the ejector levers has a pawl bearing surface for engagement with a bearing surface atop the male pin housing, and on the opposite side of the pivot point, a fingergrip surface which is extended out to provide a mechanical advantage of approximately two to one. Self aligning surfaces are also provided for first engagement with the male pin housing when a female receptacle is being inserted into a male pin housing. These surfaces automatically align or position the ejector lever relative to the bearing surface of the male pin housing.

To prevent inadvertent disengagement of the ejector lever pivot pins from the support plate notches during the insertion and interconnection process two sets of interfitting shear pins and notches are provided for each ejector lever. The first set has a shear pin extending normally out from the bottom surface of the ejector lever which interfits into a notch located in the upper surface of the lower support plate. The second set has a stop tab extending down from the bottom of the end plate interfitting into a notch formed integral in the upper surface of each ejector lever. Appropriate sizing of these notches also serves to limit the angular rotation of the ejector levers.

BEST MODE FOR CARRYING OUT INVENTION

Figure 1:
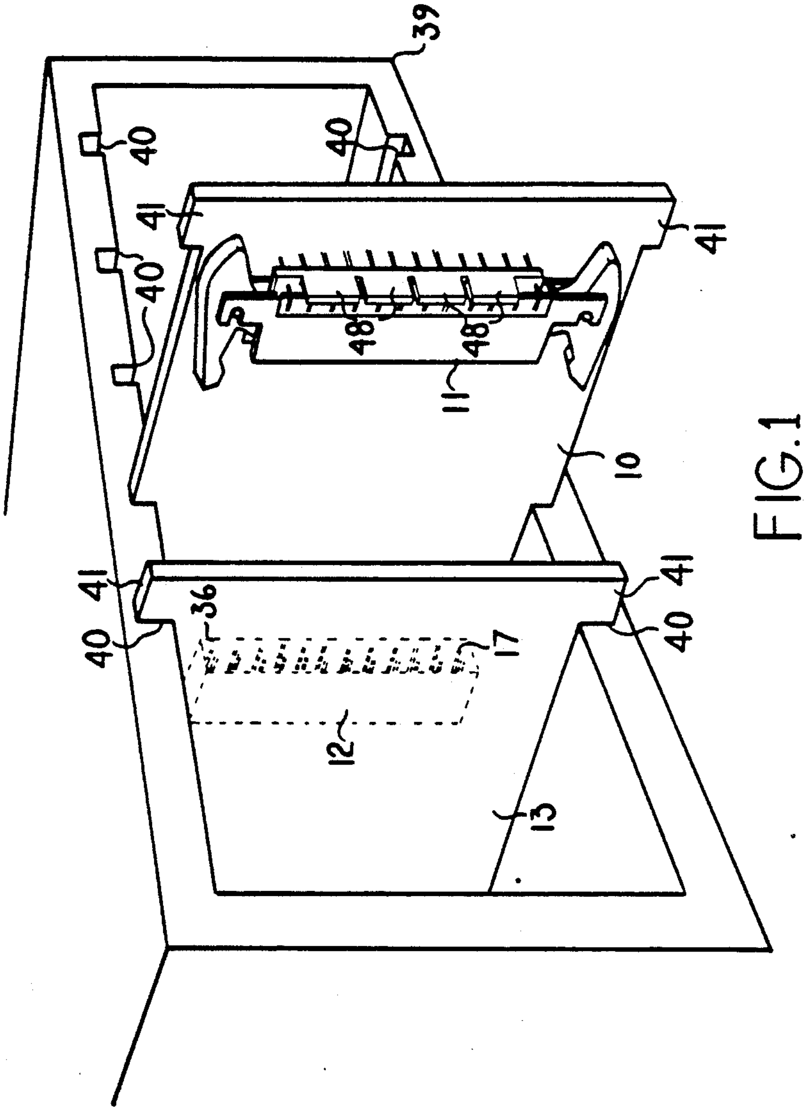
FIG. 1 is a perspective representation of a circuit board frame assembly, a motherboard and an expansion board being inserted.
Figure 2:
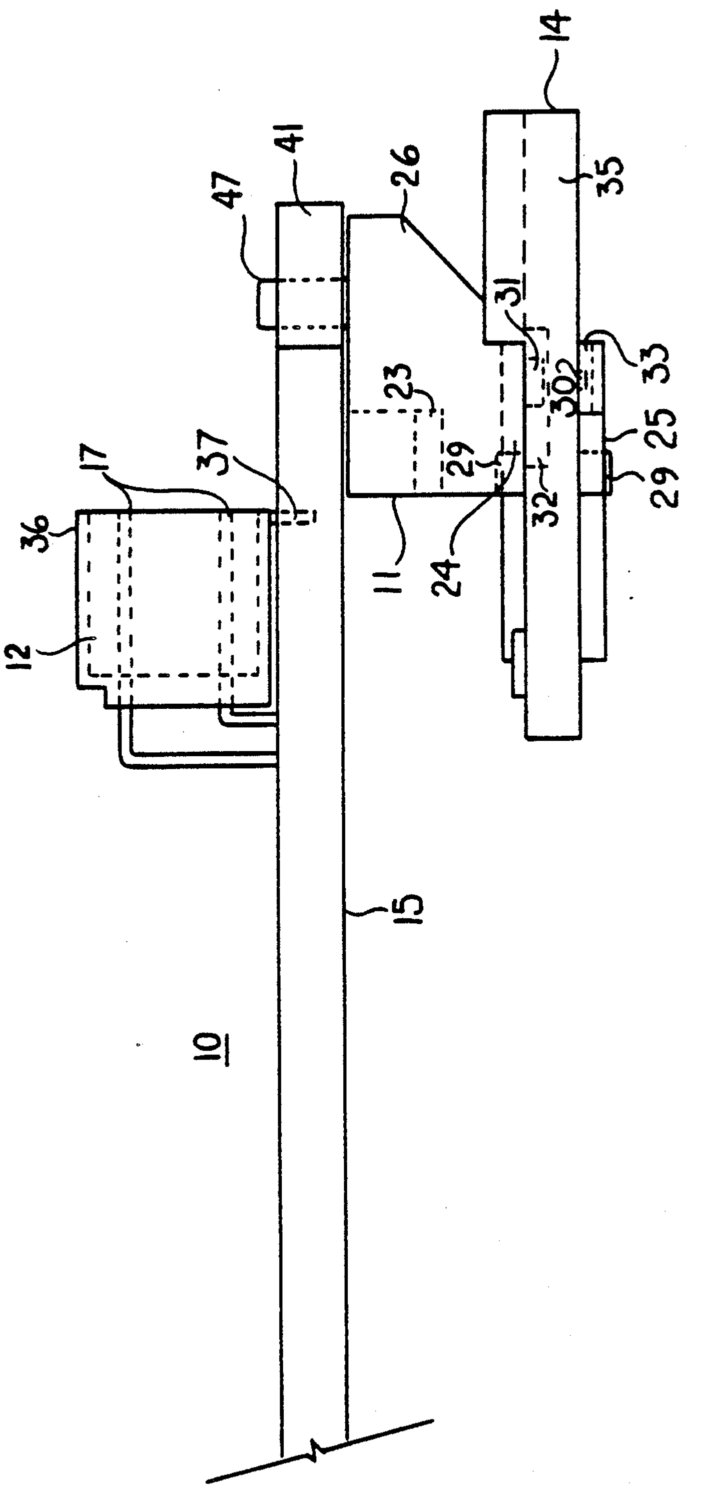
FIG. 2 is a representational side view of the interconnection system.
Figure 3:
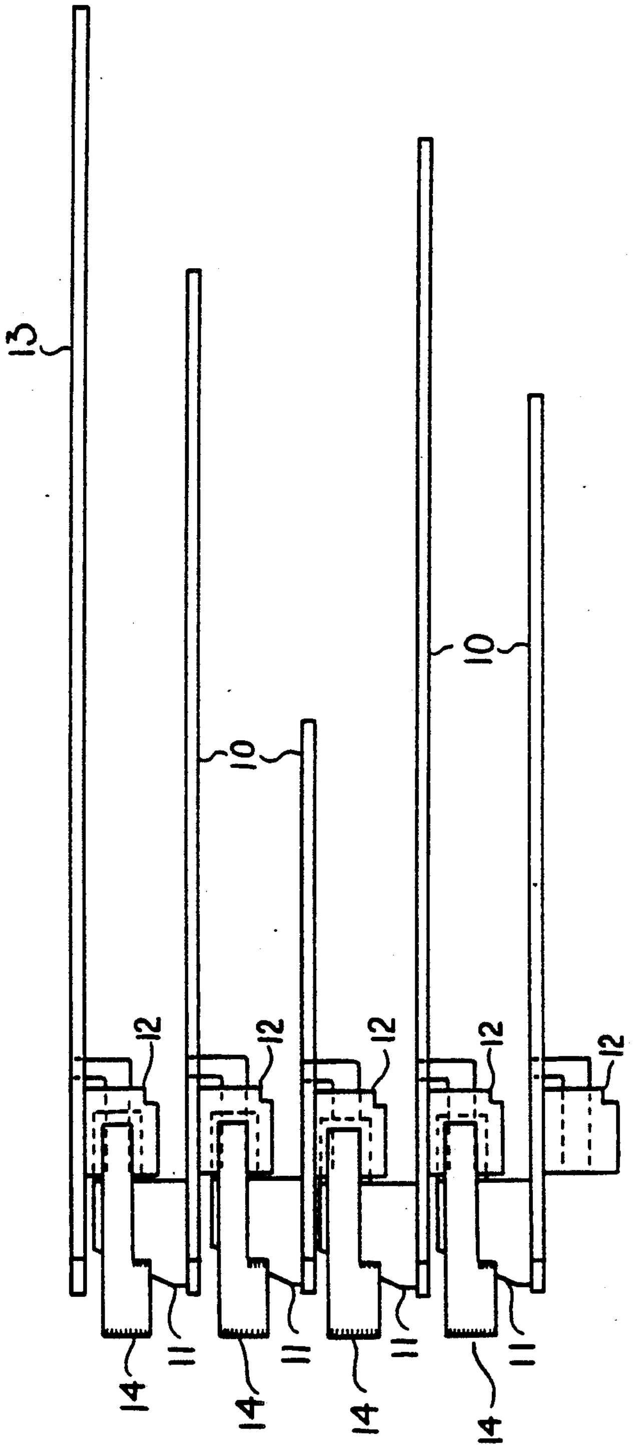
FIG. 3 is a top plan view of a plurality of boards interconnected by use of the new interconnection system.

FIGS. 1, 2, and 3, taken together, show how circuit board assemblies 10 can be used to sequentially, mechanically, and electrically, interconnect a plurality of option circuit boards 10 to motherboard 13. The apparatus envisions the use of motherboard 13 to which is attached male parallel pin connector assembly 12, which has a plurality of male pins 17 held in parallel orientation one to the other within male pin housing 36, and all parallel to the surface of motherboard 13. The electrical circuits of motherboard 13 are designed such that male pins 17 are organized into at least two and typically three separate buses, the first to provide DC electrical power to a plurality of accessory or option board assemblies 10, and normally an address bus and a data bus for transmitting and receiving electrical signals from the plurality of option or accessory board assemblies 10.

Each accessory or option board assembly 10, has circuit board 15, as shown in FIG. 2, to which is attached female connector assembly 11 on one surface and male connector assembly 12 on the opposite surface. Each connector assembly, 11 and 12, is attached to circuit board 15 by conventional soldering techniques. Connector assemblies 11 and 12 are positioned or located so as to allow interconnection of a plurality of circuit board assemblies 10, as shown in FIG. 3, mechanically one to the other with the first of said plurality of circuit board assemblies attached to motherboard 13, with all circuit boards having one common edge in alignment with each other.

As can be seen in the combination of FIGS. 1 and 3, the orientations of male connector assemblies 12 and female connector assemblies 11 are parallel to the surfaces of motherboard 13 and the accessory or option board assemblies 10, thus enabling the interconnection of a plurality of circuit board assemblies 10 with access to the circuit board assemblies from one side only. Circuit board case slots 40 of board case 39 and the orientation of female connectors 11 and male connectors 12 are all parallel one to the other, thus eliminating the need for at least two degrees for freedom of access to the circuit board assemblies for installation and interconnection of option or accessory board assemblies 10 to motherboard 13. As shown in FIG. 3, the requirement that the option or accessory board assemblies 10 be of uniform length is eliminated. Although FIG. 1 discloses circuit board case 39 which has board case slots 40 formed integral with both the upper and lower surfaces of board case 39 and the use of accessory or option board assemblies 10 of uniform height, the use of board case slots 40 formed in the upper and lower surfaces of board case 39 is not necessarily required. It is envisioned that in some applications no slots or only one set of board case slots 40 need be provided, thus eliminating even the need for option or accessory board assemblies 10 to be of uniform height. It should also be apparent that the orientation of the case and its circuit boards would be horizontal as opposed to vertical, or opening at the top as opposed to opening from the side.

Figure 4:
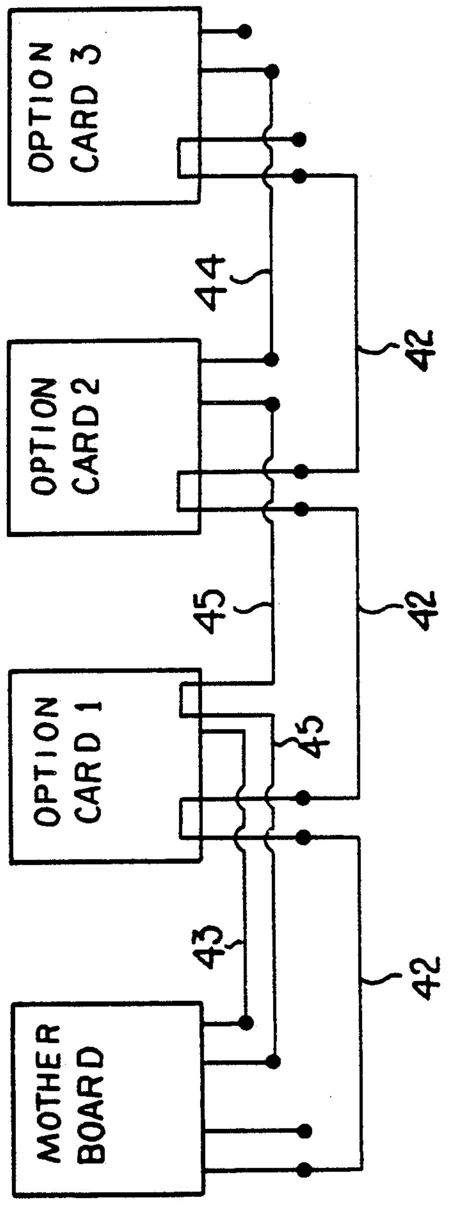
FIG. 4 is a block diagram disclosing a typical electrical interconnection of a motherboard and a plurality of accessory circuit boards.

While the mechanical interconnection of a plurality of circuit boards is serial, that is one to another in sequence, parallel electrical interconnection is limited only by the number of pins and the voltage drops caused by electrical resistance. FIG. 4 is a simplified schematic representation of the electrical interconnection of a motherboard with three option cards. As shown in FIG. 4, there is a serial interconnection of a power supply through option board bus interconnections 42. At the same time, signals to and from option cards 1 and 2 are represented by signal interconnections 43 and 45 which are, for representational purposes, electrically parallel to each other. Option card 3 on the other hand is, for signal purposes, interconnected with option card 2 by means of signal interconnection 44. It should be readily apparent that a wide variety of electrical interconnections and features can be achieved through the use of this interconnection system especially if one signal transfer bus is used with option cards having addressed signal capabilities.

Figure 5:
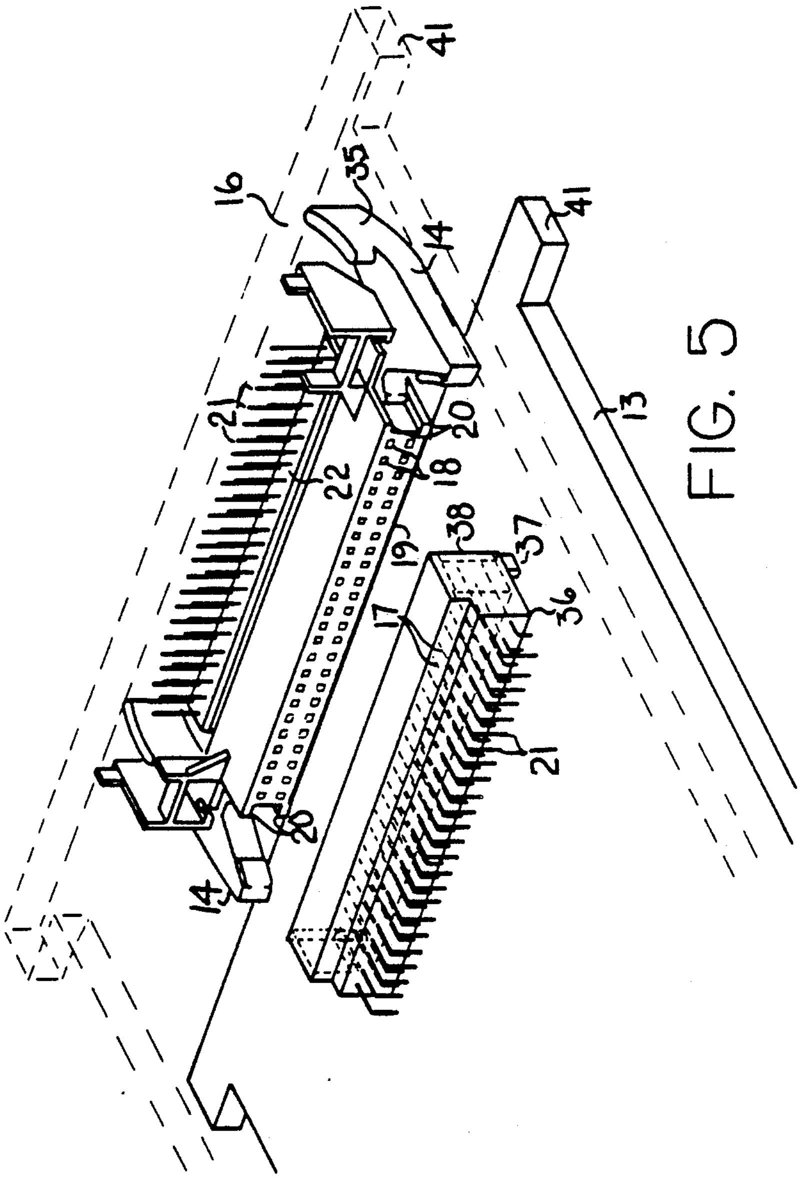
FIG. 5 is a representational perspective view of the male and female receptacles and ejector levers.
Figure 6:
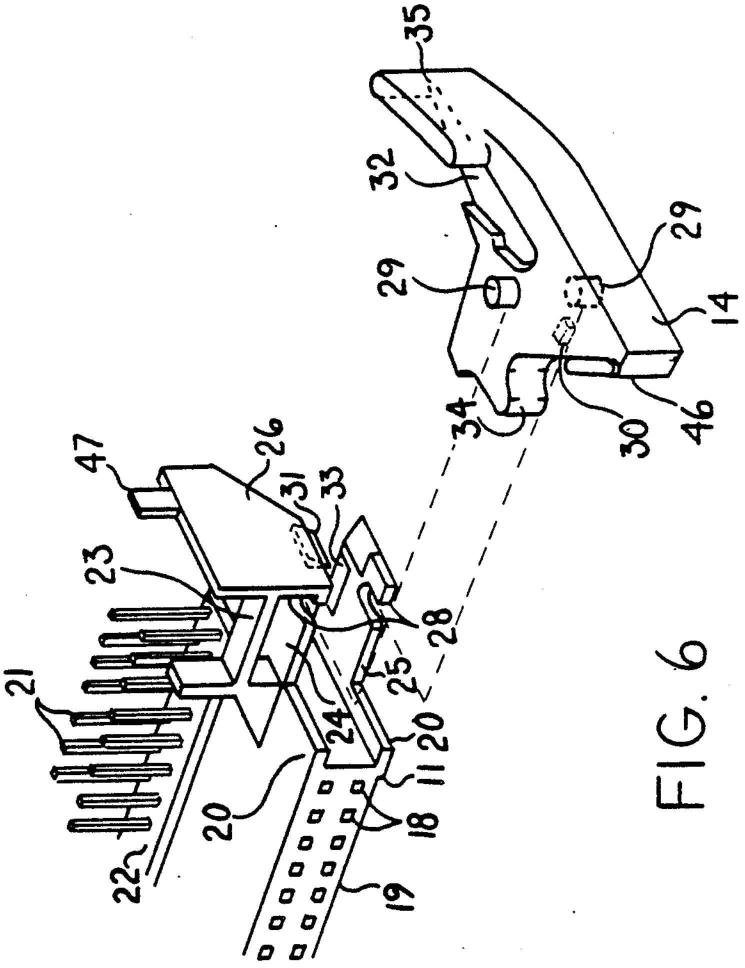
FIG. 6 is an exploded perspective representational drawing of the ejector lever and its interconnection with the female receptacle.
Figure 7A:
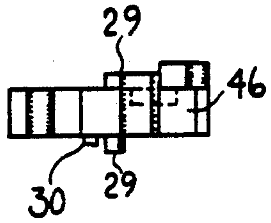
FIGS. 7*a*–7*c* are side, top, and bottom plan views of the ejector lever.
Figure 7B:
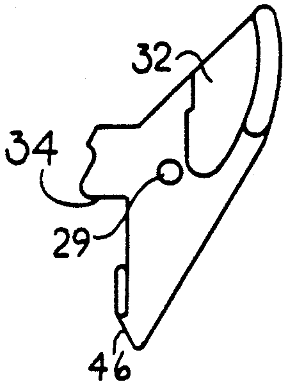
Figure 7C:
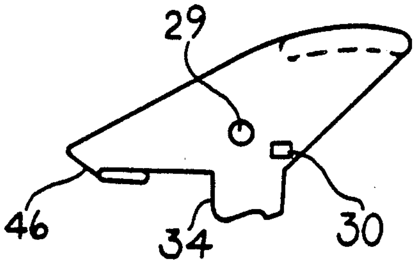

FIGS. 2, 5, and 6, show the apparatus by which the various printed circuit boards are interconnected. It should be noted at the outset that FIG. 5 is a simplified representational drawing which does not show a male connecter assembly 12 which should be attached atop option board 16. Male connecter assembly 12 for option board 16 is intentionally deleted for purposes of simplifying FIG. 5. As can be seen, from FIG. 2, male connector assembly 12 and female connector assembly 11 are offset one from the other to facilitate uniform alignment of motherboard 13 and interconnected option boards 10. While this is not essential, it has been found in practice to be useful for limiting shear forces on the connectors 11 and 12, for case design purposes as later described, and finally, for ease of access to ejector levers 14.

Also, as shown if FIGS. 1, 2, and 5, circuit board stop tabs 41 are provided to engage the edge of circuit board case 39 for three purposes. The first is to provide a means of locking motherboard 13 and option boards 10 into case 39 by use of a bracket, not shown, to wedge or hold circuit board stop tabs 41 against the edge of case 39. The second, and perhaps more important purpose, is to limit the amount of pressure that can be applied against male connector assembly 12 and female connector 11 when an option board 10 is being interconnected to either motherboard 13 or to another option board 10. In the prior art this was not a significant problem since the orientation of the male and female connector assemblies were perpendicular to the circuit boards and were, for all practical purposes, braced against them. However, in this preferred embodiment of the present invention the forces generated when interconnecting circuit boards will tend to shear the connector assemblies from the boards. Stop tabs 41 will limit how far an option board 10 can be inserted into case 39, and with the proper locating of offset male and female connector assemblies 11 and 12 on the various circuit boards, limit the amount of shear force that can be applied.

The third purpose served by stop tabs 41 is to prevent overinsertion and possible loss of an option board 10 in the event it is inserted into slots 40 upside down. As can be seen in FIGS. 2 and 3, female connector assembly 11 extends further out perpendicularly from circuit board 15 than does male connector assembly 12. In this particular embodiment it is then possible, if an option board 10 is inserted upside down, for it to pass through case 39 with male connector assemblies 12 passing by each other without contact. Stop tabs 41 prevent loss of an option board 10 in this circumstance.

As shown in FIG. 5, male connector assembly 12 has a plurality of male pins 17 arranged in parallel spaced relationship and encased with male pin housing 36. Male connector assembly 12 is attached, as shown in FIG. 5, to motherboard 13 by means of connector pins 21 which are soldered or otherwise conventionally electrically connected to the motherboard 13. Male pin housing 36 of male connector assembly 12 is further held in position by means of male connector lock tabs 37 which are inserted into corresponding holes in the circuit board..

Female connector assembly 11 is designed for insertion into male pin housing 36 with the resulting interconnection of male pins 17 in female receptacles 18.

Ejector levers 14 are provided as shown in FIGS. 1, 2, and 3. They are attached to female connector assembly 11, and bear against male pin housing 36 of male connector assembly 12, thus eliminating the need for direct contact against the printed circuit board. This is needed in order to reorient the pin connectors parallel to the boards. Female connector assembly 11 has female housing 19 together with housing extensions 20 attached to the ends thereof. Female housing 19 is sized and shaped such that the top and bottom surfaces of female housing 19 fictionally engage the inner top and bottom surfaces of male pin housing 36. Female housing extensions 20 are sized to provide frictional engagement, end wise, between female housing 19 and male pin housing 36 and yet still include a small air space between male pin housing 36 and female housing 19 in order to provide adequate space for rotational movement of ejector levers 14 so as to facilitate the engagement of pawl bearing surfaces 34 of ejector levers 14 with ejector bearing surfaces 38 of male pin housing 36 during the disconnect process. Each female connector assembly 11 has female assembly lock tabs 47 to hold the assembly on circuit board 15 at the correct location, and further has pin support bridge 22 for support of electrical connector pins 21, which themselves are inserted into, and soldered, in a conventional manner, to printed circuit board 15 of FIG. 2 and upper printed circuit board 16 as shown in FIG. 5. Push tabs 48 are formed integral with pin support bridge 22 to provide a finger bearing surface for the operator when installing and interconnecting option board 10 with another circuit board.

Extending out from the edges and formed integral with female housing 19 are upper extension bridge support plates 23, intermediate extension support plates 24, and bottom extension plates 25. Upper extension bridge support plates 23 and intermediate extensions support plates 24 are interconnected by end plates 26 to form cantilevered support bridges for purposes of providing structural integrity for ejection levers 14.

Two ejector levers 14 are attached to each female connector assembly 11, and are reverse mirror images of each other. Ejector levers 14 have complex surface structures which include pawl bearing surfaces 34 and finger grip surfaces 35, and are pivoted about upper and lower ejector lever pins 29 to provide a mechanical advantage of approximately 2 to 1 against ejector bearing surfaces 38 of male pin housing 36 when a service technician squeezes the opposing finger grip surfaces 35 of ejector levers 14 toward each other. Self aligning surfaces 46 are provided to ensure ejector levers 14 are automatically and correctly positioned when female connector assembly 11 is being inserted into male connector housing 36.

Formed integral with each ejector lever 14, in addition to ejector pivot pins 29, are ejector shear pin 30 and the ejector lever notch 32, as shown in FIGS. 6 and 7*a* through 7*c*.

As shown in FIG. 6, ejector pin notches 28 are provided in intermediate extensions support plates 24 and bottom extension support plates 25 adjacent the open pin receptacle end of female housing 19 for receiving ejector pivot pins 29 of ejector levers 14.

It should be apparent from a review of FIGS. 1, 5, and 6 that if one were to push against ejector levers 14, particularly at finger grip surfaces 35 when inserting option board 10 into case assembly 39 as shown in FIG. 1, instead of against push tabs 48, that ejector pivot pins 29 would quickly disengage from ejector pin notches 28, thereby releasing the ejector levers 14 from female connector assembly 11. To prevent this, each ejector lever 14 is formed with integral ejector shear pin 30 which itself is snap interfitted into bottom extension support notch 33 formed in bottom extension support plate 25. In addition, end plate stop tabs 31 which are formed integral with end plates 26, are provided to snap interfit with ejector lever notches 32. Both end plate stop tabs 31 and ejector shear pins 30 serve dual purposes, the first, to limit the angular rotation of ejector levers 14 about ejector pins 29. And secondly, to provide bearing surfaces against which the forces applied to ejector levers 14 when inserting female connector assembly 11 into male connector assembly housing 36 can be applied. In the preferred embodiment, shear pins 30 are sized to fail before either the cantilevered bridge assemblies formed by upper extension bridge support plates 23 and intermediate support plates 24, or lower bridge support plates 25, would fail and separate from female connector assembly 11, in the event that too much force is applied when printed circuit boards 10 are being interconnected in case 39.

It should be readily apparent that the present design contemplates and facilitates the orientation of circuit board case 39 in any direction except opening or facing down. All that is required to insert or remove circuit boards is access to case 39 from the open side only. To insert an option board 10, one merely gains access to the open side of case 39, and inserts option boards 10 into case slots 40. Self aligning surfaces 46 of ejector levers 14 will contact male pin housing 36, and automatically align ejector levers 14 with male connector assembly 12 to facilitate insertion of female connector assembly 11. Circuit board stop tabs 41 will limit how far option board 10 can be inserted into case 39, thus automatically preventing over insertion and thereby preventing the application of excessive shear pressure on male and female connector assemblies 11 and 12.

Removal of an option board 10 is equally simple. All the service technician has to do is to squeeze fingergrip surfaces 35 of ejector levers 14 towards each other to engage pawl bearing surfaces 34 against ejector lever bearing surfaces 38 of male pin housing 36, thus ejecting female connector assembly 11 from male pin housing 36. Once male and female connector assemblies 12 and 11 are disconnected, option board 10 can be easily withdrawn from case 39.

The operation of ejector levers 14, directly against bearing surface 38 of male pin housing 36, provides an additional feature in that more than one option board 10 can be removed from the case simultaneously and still provide functional ejector levers 14 on the boards after they have been removed as an interconnected assembly from case 39. This would not be possible if, for example, ejector levers 14 were to bear directly against case 39.

While there is shown and described the present preferred embodiment of the invention, it is to be distinctly understood that this invention is not limited thereto but may be variously embodied to practice within the scope of the following claims.

We claim:

1. An electrical circuit board having a male parallel pin connector attached to one surface of said board for interconnection with a mating female parallel pin connector and a female parallel pin connector attached to the other surface of said board for interconnection with a mating male parallel pin connector;

said male parallel pin connector has a plurality of electrical connector pins all oriented parallel to the surface of said circuit board and the female parallel pin connector has a corresponding, mating, plurality of parallel pin receptacles all oriented parallel to the surface of said circuit board;

a generally rectangular male pin housing, having elongated sides and opposing ends, attached to and enclosing the perimeter of the pins, said male pin housing having bearing surfaces adjacent the ends of said housing;

a generally rectangular female receptacle housing having elongated sides, and opposing ends with extension tabs for creating a space between the female receptacle housing ends and the interior ends of a mating male pin housing for interfitting insertion into a male pin housing of similar construction to that attached to the opposite side of the circuit board;

an upper support plate extending out from each end of the rectangular female receptacle housing;

an intermediated support plate extending out from each end of the rectangular female receptacle housing;

an end plate connecting the extended ends of each pair of upper and intermediate support plates to form a pair of opposing cantilevered upper support bridges;

a lower support plate extending out from each end of the rectangular female receptacle housing parallel to the upper support bridges;

said intermediate support plates and lower support plates each having a notch cut therein on the side edge of said plates adjacent the receptacle end of the female receptacle housing;

a pair of ejection levers each substantially a mirror image of the other;

a pair of pivot pins, attached to opposing surfaces of each ejection lever and in coaxial alignment with each other; and a lever portion on each lever disposed in said space between said female receptacle housing ends, each having a pawl bearing surface for engaging said bearing surfaces on said male pin housing.

2. The electrical circuit board of claim 1 wherein the means for pivotally retaining a pair of ejector levers further comprises:

a shear pin extending normally out from a surface of each ejector lever for interfitting engagement in a noteh cut in each lower support plate;

said lower support plates each having a notch cut therein for receiving a shear pin;

said ejector lever each having a notch cut in the upper surface for interfitting engagement with a tab extending down from an end plate; and a stop tab extending down from each end plate for interfitting engagement with an ejector lever notch.

3. The electrical circuit board of claim 2 wherein the means for pivotally retaining a pair of ejector levers further comprises said shear pins and said stop tabs being sized and shaped to fail by shearing action prior to structural failure of the cantilevered bridge formed by the upper and intermediated support plates and end plate and the lower support plate.

4. The electrical circuit board of claim 2 wherein each of said ejector levers further includes:

a self-aligning surface extending out from each pawl bearing surface for first engagement with the male pin housing when inserting the female receptacle housing into said male pin housing, for aligning the pawl bearing surfaces for bearing against the bearing surfaces of the male pin housing.

5. A pin interconnection assembly comprising:

a plurality of male electrical connector pins:

a generally rectangular male pin housing, having elongated sides and opposing ends, enclosing and supporting the pins in spaced relationship one to the other, said pin housing further having bearing surfaces adjacent the ends of said housing for;

a generally rectangular female receptacle housing having a plurality of female electrical receptacles for mating interfitting connection with the plurality of male electrical connector pins, and further having elongated sides and opposing ends with extension tabs for creating a space between the female receptacle housing and the interior ends of the male pin housing, said female receptacle housing sized for interfitting insertion into the male pin housing;

an upper support plate extending out from each opposing end of the rectangular female receptacle housing;

an intermediate support plate extending out from each opposing end of the rectangular female receptacle housing;

an end plate connecting the extended ends of each pair of upper and intermediate support plates to form a pair of opposing cantilevered upper support bridges;

a lower support plate extending out from each end of the rectangular female receptacle housing parallel to the upper support bridges;

said intermediate support plates and lower support plates each having a notch therein on the side edge of said plates adjacent the receptacle end of the female receptacle housing;

a pair of ejection levers, and a pair of pivot pins, attached to opposing surfaces of each ejection lever and in coaxial alignment with each other, for pivotable engagement with said notches.

6. The pin interconnection assembly of claim 5 wherein the means for pivotally retaining a pair of ejector levers further comprises:

a shear pin extending normally out from a surface of each ejector lever for interfitting engagement in a notch cut in each lower support plate;

said lower support plates each having a notch cut therein for receiving a shear pin;

said ejector lever each having a notch cut in the upper surface for interfitting engagement with a tab extending down from an end plate; and a stop tab extending down from each end plate for interfitting engagement with an ejector lever notch.

7. The pin interconnection assembly of claim 6 wherein the means for pivotally retaining a pair of ejector levers further comprises said shear pin and said stop tab are sized and shaped to fail by shearing action prior to structural failure of the cantilevered bridge formed by the upper and intermediated support plates and end plate and the lower support plate.

8. The electrical circuit board of claim 6 wherein each of said ejector levers further includes:

a self-aligning surface extending out from each pawl bearing surface for first engagement with the male pin housing when inserting the female receptacle housing into said male pin housing, for aligning the pawl bearing surfaces for bearing against the bearing surfaces of the male pin housing.

* * * * *